(12) United States Patent
Mauksch

(10) Patent No.: US 7,969,367 B2
(45) Date of Patent: Jun. 28, 2011

(54) ANTENNA COUPLER

(75) Inventor: Thomas Mauksch, Tuntenhausen (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 295 days.

(21) Appl. No.: 12/376,563

(22) PCT Filed: Sep. 3, 2007

(86) PCT No.: PCT/EP2007/007676
§ 371 (c)(1),
(2), (4) Date: Mar. 31, 2009

(87) PCT Pub. No.: WO2008/037333
PCT Pub. Date: Apr. 3, 2008

(65) Prior Publication Data
US 2010/0039333 A1    Feb. 18, 2010

(30) Foreign Application Priority Data
Sep. 27, 2006    (DE) .......................... 10 2006 045 645

(51) Int. Cl.
*G01R 29/10* (2006.01)
(52) U.S. Cl. ...................................... 343/703; 455/67.11
(58) Field of Classification Search .................. 343/703, 343/904, 905, 906, 742, 867; 455/67.11, 455/67.7
See application file for complete search history.

(56) References Cited

U.S. PATENT DOCUMENTS

| | | | |
|---|---|---|---|
| 4,433,336 A | 2/1984 | Carr | |
| 4,588,993 A | 5/1986 | Babij et al. | |
| 6,215,448 B1 * | 4/2001 | DaSilva et al. | 343/703 |
| 6,229,490 B1 | 5/2001 | Hofmann | |
| 6,915,111 B2 * | 7/2005 | Chen et al. | 455/67.11 |
| 7,038,629 B2 * | 5/2006 | Holzmann et al. | 343/703 |
| 2002/0154066 A1 | 10/2002 | Barna et al. | |
| 2004/0032365 A1 | 2/2004 | Gottl et al. | |
| 2004/0233114 A1 | 11/2004 | Holzmann et al. | |
| 2005/0264469 A1 | 12/2005 | Nowotarski | |
| 2006/0258293 A1 | 11/2006 | Steffen et al. | |
| 2007/0178754 A1 | 8/2007 | Schlegel et al. | |
| 2008/0303725 A1 | 12/2008 | Hackenbroich et al. | |

FOREIGN PATENT DOCUMENTS

| | | |
|---|---|---|
| CA | 2 381 384 | 2/2001 |
| DE | 201 04 199 | 7/2001 |
| DE | 201 04 199 U1 | 7/2001 |
| DE | 297 24 576 U1 | 5/2002 |
| DE | 102 08 210 A1 | 9/2002 |
| DE | 101 29 408 A1 | 1/2003 |
| DE | 102 37 823 A1 | 3/2004 |
| DE | 103 18 296 B3 | 1/2005 |

(Continued)

OTHER PUBLICATIONS

International Search Report for PCT/EP2007/007676 dated Oct. 29, 2007.

(Continued)

*Primary Examiner* — Hoang V Nguyen
(74) *Attorney, Agent, or Firm* — Marshall, Gerstein & Borun LLP

(57) ABSTRACT

An antenna coupler for testing a transmitter and/or receiver device for wireless communication, in particular, a mobile telephone, comprises a holding element for the transmitter and/or receiver device and several antenna elements, which are arranged in such a manner that the directions of maximum radiation or respectively directions of maximum sensitivity of the antenna elements are oriented differently relative to one another in space.

16 Claims, 4 Drawing Sheets

FOREIGN PATENT DOCUMENTS

| | | |
|---|---|---|
| DE | 103 29 396 A1 | 1/2005 |
| DE | 103 56 087 A1 | 6/2005 |
| DE | 10 2004 033 383 A1 | 11/2005 |
| EP | 0 895 300 B1 | 2/1999 |
| EP | 0 999 607 A2 | 5/2000 |
| GB | 2 324 657 | 10/1998 |
| WO | WO-02/11237 | 2/2002 |
| WO | WO-02/103840 | 12/2002 |

OTHER PUBLICATIONS

Philips, "Measuring magnetic fields in you own home," *Electronics World*, 97:281-283 (1992).

Puranen et al., "Simultaneous Measurements of RF Electric and Magnetic near Fields-Theoretical Considerations," *IEEE Transactions on Instrumentation and Measurement*, 42:1001-1008 (1993).

\* cited by examiner

US 7,969,367 B2

ANTENNA COUPLER

BACKGROUND OF THE INVENTION

1. Field of the Invention

The invention relates to an antenna coupler for testing a transmitter and/or a receiver device, in particular, a mobile telephone.

2. Related Technology

An antenna coupler is used for testing a transmitter and/or a receiver device, in particular, a mobile telephone. The antenna coupler allows a complete final testing of the mobile telephone, because radio properties of the mobile telephone, in particular the antenna efficiency, are tested. Moreover, in testing the mobile telephone, a plurality of properties and/or parameters of the mobile telephone are investigated, which can be roughly subdivided into transmitter tests and receiver tests. For example, in the case of a transmitter test, a measurement of the phase error, the frequency error, the power and/or the spectrum is implemented. In the case of a reception test, for example, bit-error rates are measured.

The coupling of the transmitter and/or the receiver device is effected via an antenna element provided on the antenna coupler, wherein the coupling factor, which indicates the ratio of the received power relative to the overall transmitted power of the transmitter and/or receiver device, should remain as unchanged as possible in the event of changes of position of the transmitter and/or receiver device. An antenna coupler of this kind is known from DE 101 29 408 A1.

However, the antenna coupler disclosed in DE 101 29 408 A1 has proved inadequate for testing a transmitter and/or receiver device with an antenna arrangement, which provides several antennas, operating in a MIMO (multiple-in multiple-out) system, in a Smart-Antenna system or according to an Antenna-Diversity method.

GENERAL DESCRIPTION OF THE INVENTION

The invention therefore provides an antenna coupler, which is particularly suitable for testing a transmitter and/or receiver device, which has a complex radiation characteristic and/or reception characteristic.

According to the invention, an antenna coupler for testing a transmitter and/or receiver device, in particular, a mobile telephone, comprises a holding element for the transmitter or receiver device and several antenna elements, which are arranged in such a manner that the directions of maximum radiation or respectively directions of maximum sensitivity of the antenna elements are oriented differently relative to one another in space.

In order to test a transmitter or receiver device providing a particularly complex radiation characteristic and/or reception characteristic, the antenna coupler comprises several antenna elements, which are arranged on the antenna coupler in such a manner that directions of maximum sensitivity or respectively directions of maximum radiation of the antenna elements of the antenna coupler are oriented differently in space. Furthermore, the antenna coupler provides a holding element for holding the transmitter and/or receiver device. The transmitter or receiver device is designed, in particular, as a mobile telephone.

The advantages achieved with the invention are, in particular, that properties of a transmitter and/or of a receiver device, which is operated in a MIMO system and provides an antenna arrangement with several antennas arranged, for example, in linear independence of one another, can be analyzed as a complete device (DUT) in a very reliable manner by means of the antenna coupler according to the invention.

Moreover, the antenna coupler according to the invention is suitable for testing a transmitter and/or receiver device operated in a Smart-Antenna system or according to the Antenna-Diversity method.

Furthermore, the antenna coupler according to the invention is designed for reception and/or transmission of differently-polarized waves and is particularly suitable for testing a transmitter and/or receiver device, which is designed as a mobile telephone or as a blue-tooth device.

With a different spatial orientation of the directions of maximum sensitivity of the antenna elements, radiation characteristics of the transmitter, for example, of a MIMO system, can be analyzed very accurately for the transmitter test by means of the antenna coupler according to the invention.

For the receiver test, the antenna coupler generates different radiation-diagram configurations by means of different spatial orientation of the directions of maximum radiation of the antenna elements. Through external connection of the antenna coupler, the receiver device can be irradiated simultaneously with beams from several different directions, wherein the different beams can carry the same or different signals. If one beam carries the useful signal and another carries the interference signal, the directionally-selective reception of the useful signal in combination with the directionally-selective suppression of the interference signal can be tested. The differentiation of useful signals from different beams is the essence of a MIMO system and can be represented by this antenna coupler. That is to say, an antenna coupler of this kind supports not only the very accurate testing of the receiver properties and directional-reception properties; as the last example shows, it is also meaningful for receiver and protocol testing of a MIMO transmitter/receiver.

According to one advantageous development, one or more of the antenna elements are oriented with the direction of maximum sensitivity and/or the direction of maximum radiation facing towards the transmitter and/or receiver device. The antenna elements can expediently be oriented independently of one another. For this purpose, the antenna coupler preferably provides an orientation device.

In one expedient further development, the power transmitted from the antenna elements can be adjusted separately at each antenna element through feeding.

According to one advantageous further development, the antenna elements are each positioned on the antenna coupler at an appropriate spacing distance from the transmitter and/or the receiver device.

Dependent upon the purpose of the test, the spacing distance between the transmitter and/or the receiver device and one or more of the antenna elements of the antenna coupler is $\lambda/4$, (near field) or multiples of $\lambda$ (distant field), wherein $\lambda$ corresponds to the wavelength of the wave received or respectively radiated by the respective antenna element.

According to one advantageous development, several antenna elements of the antenna coupler are provided on coordinate axes of a coordinate system, wherein the transmitter and/or receiver device is expediently arranged at the coordinate origin.

According to one advantageous further development, the coordinate axes extend in an orthogonal manner relative to one another, so that the coordinate system is a Cartesian coordinate system.

For a particularly accurate analysis of the radiation characteristic and/or the reception characteristic of the transmitter and/or receiver device, an antenna element is provided respectively both in the positive coordinate-axis direction and also in the negative coordinate-axis direction on the coordinate axes of the coordinate system.

According to one advantageous embodiment, the antenna elements of the antenna coupler are disposed at corners of an octahedron, wherein the transmitter and/or receiver device is expediently disposed at the center point of the octahedron.

According to one advantageous embodiment, the antenna elements of the antenna coupler are designed as rod antennas, as loop antennas, as Yagi antennas or in a mixed manner as rod antennas, Yagi antennas and loop antennas.

In one expedient further development, the antenna element designed as a loop antenna is substantially of a circular-ring shape and is expediently designed as a substantially-closed loop, wherein a minimum-possible spacing distance is preferably provided between the feedpoint at a feeder end of the loop and a loop end disposed opposite to the feeder end of the loop. The antenna element designed as a loop element expediently comprises an outer conductor and an inner conductor, which is preferably guided outwards from the outer conductor in the region of the feeder end of the loop and/or in the region of the loop end disposed opposite to the latter and is expediently connected to the outer conductor in an electrically-conductive manner. According to one advantageous embodiment, the antenna element designed as a loop antenna is held by a holder, for example, made of Teflon.

According to one advantageous further development, the circumference of the antenna element designed as a loop antenna corresponds substantially to the mean wavelength $\lambda$ of the wave radiated and/or received via the antenna element.

The polarization direction of the waves radiated and/or received by the antenna element designed as a loop antenna is expediently adjustable. For this purpose, the antenna element is preferably mounted in a rotatable manner about a central axis, which is oriented perpendicular to a plane formed by the loop.

In an expedient further development, the antenna element designed as a loop antenna is oriented, with reference to the transmitter and/or the receiver device preferably provided at the coordinate origin of the coordinate system, in such a manner that the central axis of the loop antenna is directed towards the transmitter and/or receiver device.

In an advantageous further development, the connections between the respective antenna elements of the antenna coupler and the external contact of the antenna coupler of the same electrical length, is known to the user.

In order to fix the transmitter and/or receiver device to the holding element, the holding element preferably provides a fastening device.

BRIEF DESCRIPTION OF THE DRAWINGS

Exemplary embodiments of the invention are explained in greater detail below with reference to the drawings. The drawings are as follows.

DETAILED DESCRIPTION

Mutually-corresponding components are indicated with identical reference numbers in all the drawings.

Figure 1:
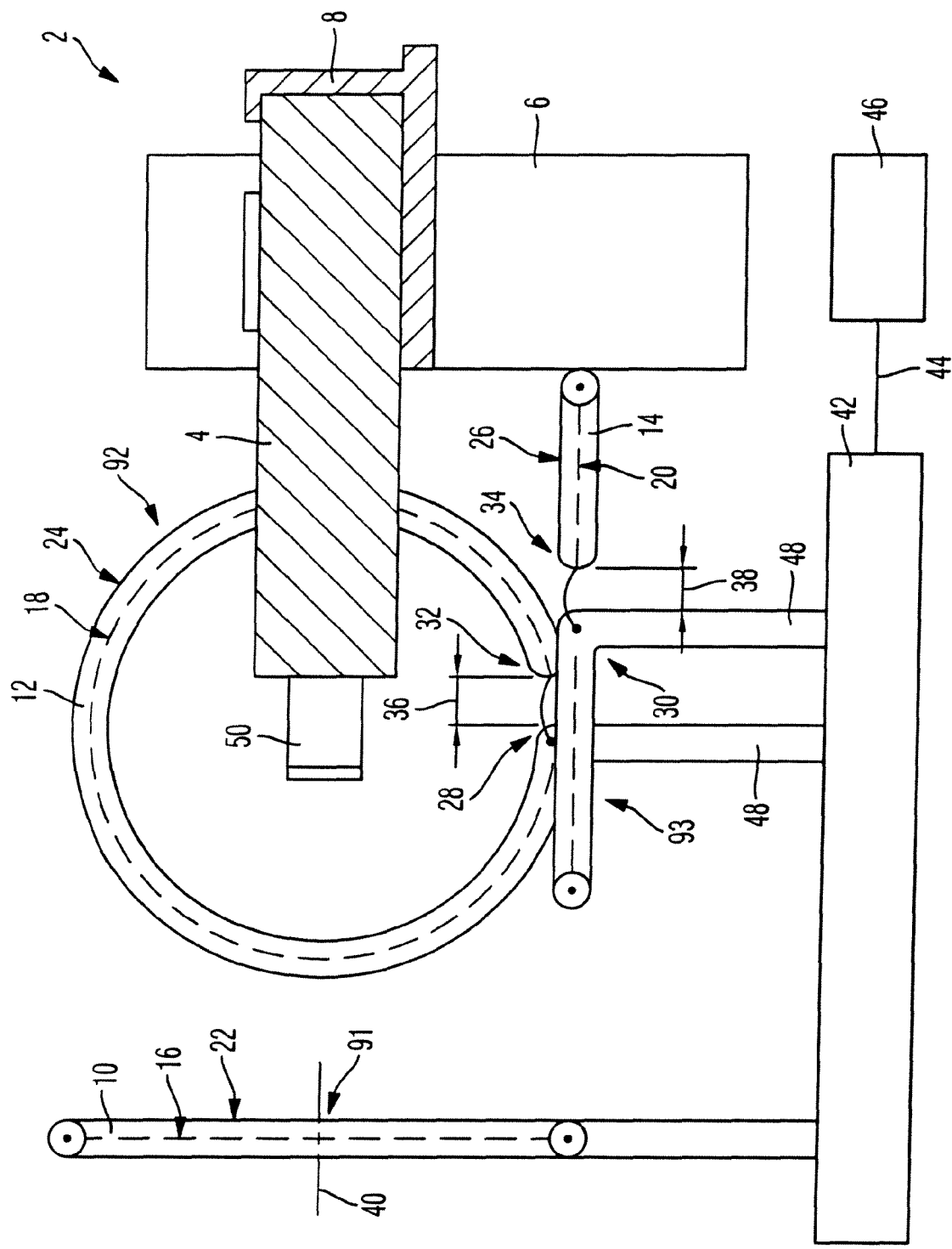
FIG. 1 shows schematically a longitudinal section through an antenna coupler with antenna elements designed as loop antennas and a transmitter and/or receiver device designed as a mobile telephone.

FIG. 1 shows schematically a longitudinal section through an antenna coupler 2 for testing a mobile telephone 4 designed as the transmitter and/or receiver device, which is held on a holding element 6 and fixed to a fastening device 8. In the exemplary embodiment according to FIG. 1, the antenna coupler 2 comprises three antenna elements 91, 92, 93 designed as loop antennas 10, 12, 14.

Each loop antenna 10, 12, 14 provides an inner conductor 16, 18, 20 marked in FIG. 1 with broken lines and, surrounding the inner conductor 18, 20, 22, an outer conductor 22, 24, 26, which shields the inner conductor 16, 18, 20. The outer conductor 22, 24, 26 encloses the inner conductor 16, 18, 20 in the manner of a cylindrical casing. A dielectric, which is not illustrated in FIG. 1, is preferably provided between the inner conductor 16, 18, 20 and the outer conductor 22, 24, 26. The loop antenna 10, 12, 14 is formed substantially as a spatially-closed loop, wherein a minimum possible spacing distance 36, 38 is provided between the feedpoint 28, 30, visible in FIG. 1 only on the loop antenna 12, 14, at a feeder end of the loop and a loop end 32, 34 disposed opposite to the latter. At the loop end 32, 34 of the loop antenna 12, 14, the inner conductor 18, 20 projects outwards from the outer conductor 22, 26. The inner conductor 18, 20 is guided in the region of the feedpoint 28, 30 at the feeder end of the loop onto the outer conductor in order to establish an electrical contact between the inner conductor 18, 20 and the outer conductor 24, 26.

The loop antenna 10, 12, 14 is preferably held by a holder not illustrated in FIG. 1. By rotation of the loop antenna 10, 12, 14 about a central axis 40 disposed perpendicular to a plane formed by the loop of the loop antenna 10, which is marked in FIG. 1 only for the loop antenna 10, the polarization direction of waves radiated from the loop antenna 10, 12, 14 are variable and/or waves of different polarization can be detected via the loop antenna 10, 12, 14.

The loop antennas 10, 12, 14 are each coupled to an antenna base 42, which is connected via a signal line 44 to a measurement and control arrangement 46.

In order to achieve an advantageous radiation characteristic and/or reception characteristic, the circumference of the loop antennas 10, 12, 14 corresponds substantially in each case to the mean wavelength $\lambda$ of the waves, which are radiated or respectively received by the loop antennas 10, 12, 14.

The electrical and magnetic components of an electrical field radiated from an antenna arrangement 50 of the mobile telephone 4 can be measured in a particularly accurate manner with an arrangement of several antenna elements with directions of maximum radiation and/or directions of maximum sensitivity oriented differently in space, which is shown in the exemplary embodiment according to FIG. 1 with three antenna elements designed as loop antennas 10, 12, 14.

Moreover, in the case of the antenna elements designed as loop antennas 10, 12, 14, the coupling factor between the loop antennas 10, 12, 14 and the antenna arrangement 50, which provides, for example, several antennas for the realization of a MIMO system in the mobile telephone, is substantially independent of the precise geometric position of the antenna arrangement 50 relative to the loop antennas 10, 12, 14, so that a spatially-accurate adjustment of the mobile telephone 4 comprising the antenna arrangement 50 on the antenna coupler 2 is not required.

Figure 2:
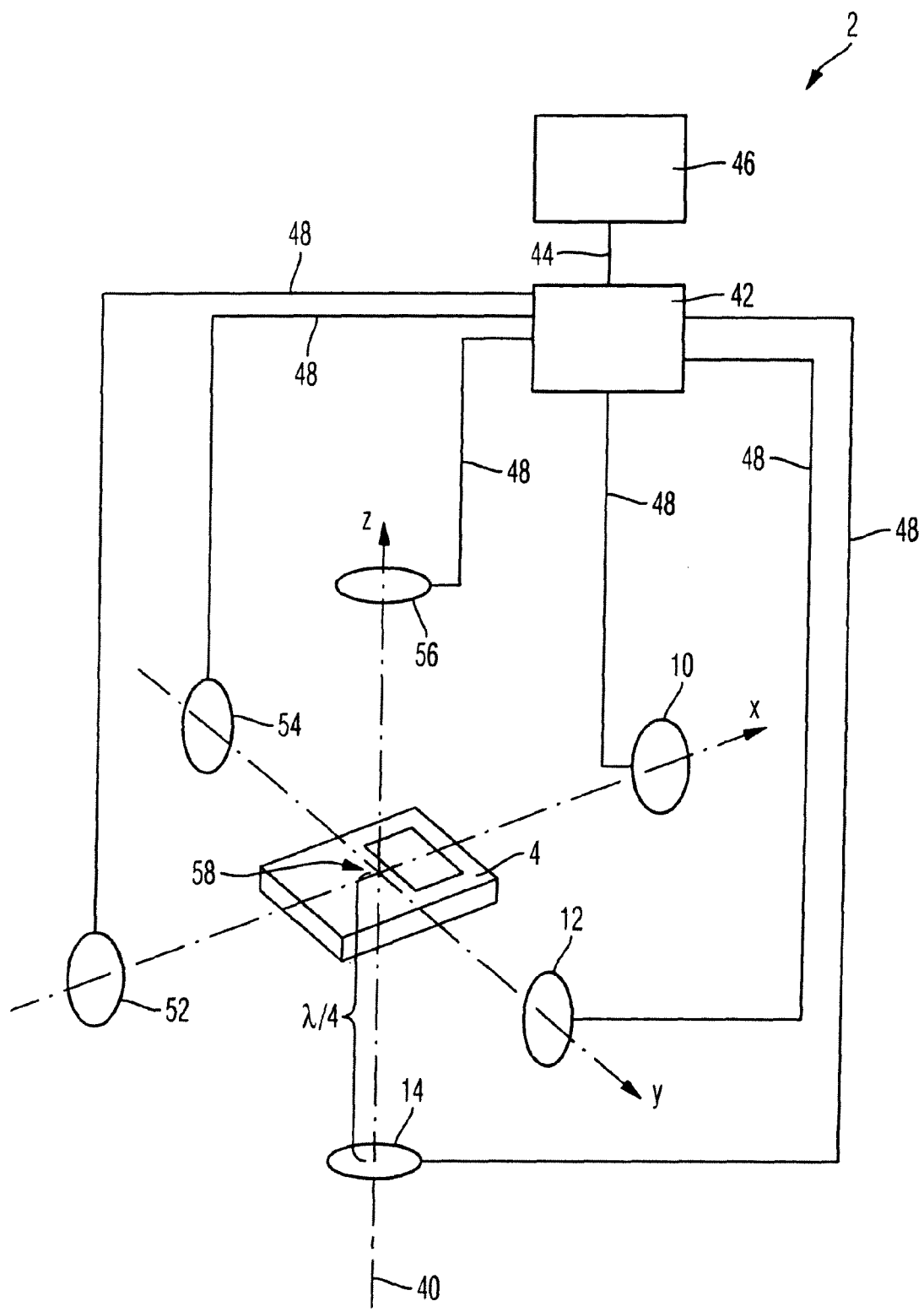
FIG. 2 shows schematically a plan view of an antenna coupler with antenna elements designed as loop antennas and a transmitter and/or receiver device designed as a mobile telephone.

FIG. 2 shows a schematic plan view of the antenna coupler 2 in a further exemplary embodiment. Antenna elements designed as loop antennas 10, 12, 14, 52, 54, 56 are arranged substantially at the corners of an octahedron. By way of illustration of the octahedral arrangement of the loop antennas 10, 12, 14, 52, 54, 56, coordinate axes x, y, z of a Cartesian coordinate system are shown by dotted lines in FIG. 2. The loop antennas 10, 12, 14, 52, 54, 56 are positioned on the coordinate axes x, y, z in negative and also in positive coordinate-axis direction, wherein the central axes 40 of the loop antennas 10, 12, 14, 52, 54, 56, disposed perpendicular to planes formed by loops of the loop antennas 10, 12, 14, 52, 54, 56, extend along the coordinate axes x, y, z and intersect at a coordinate origin 58, at which the mobile telephone 4 is positioned. In the exemplary embodiment shown in FIG. 2, the antenna arrangement of the mobile telephone 4 is designed to be integrated within the latter and is therefore not visible in FIG. 2.

Each loop antenna 10, 12, 14, 52, 54, 56 is arranged substantially at a spacing distance λ/4 relative to the mobile telephone 4. Furthermore, the loop antennas 10, 12, 14, 52, 54, 56 are guided to the antenna base 42 via connecting lines 48, which each provide the same electrical length.

Figure 3:
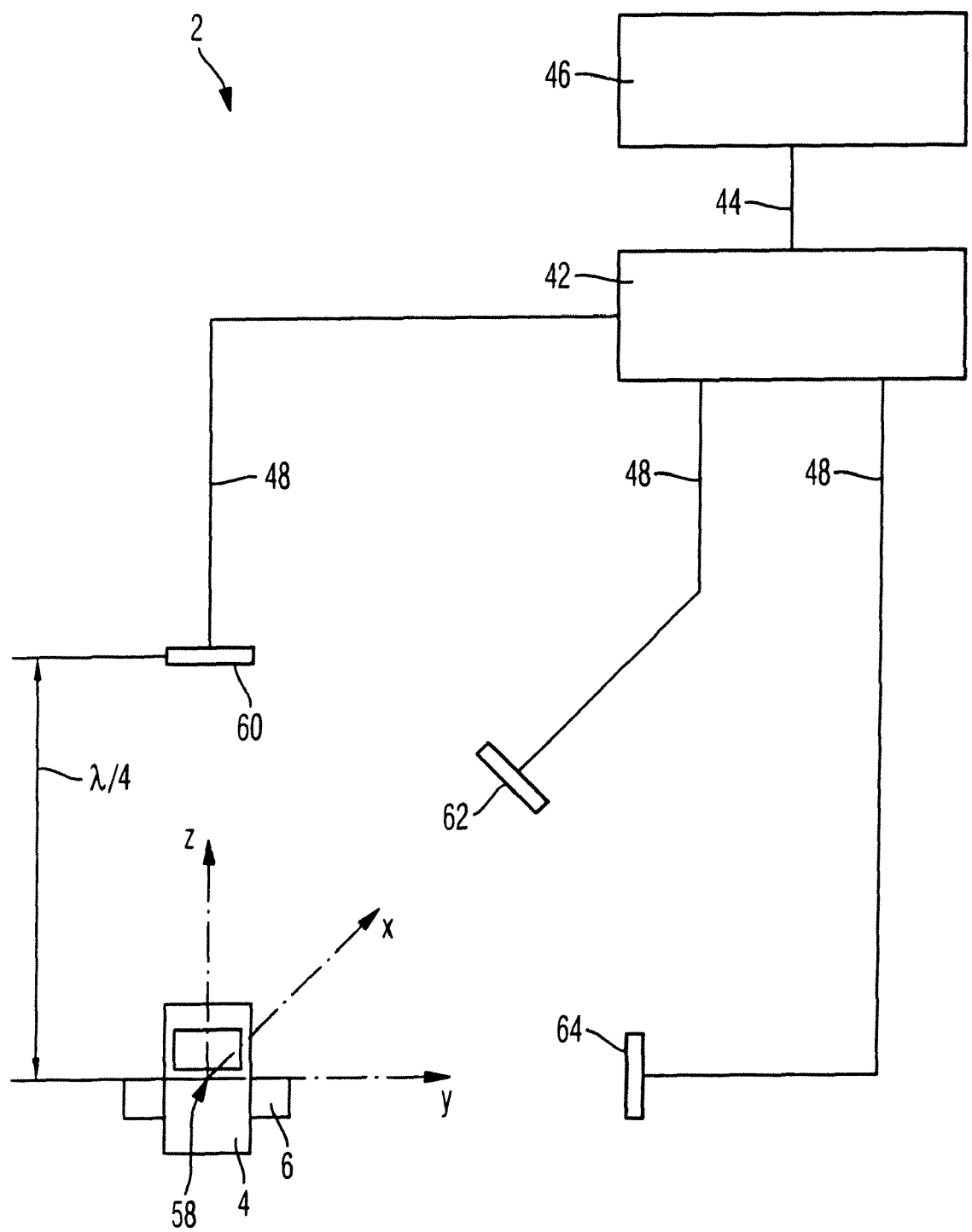
FIG. 3 shows schematically a plan view of an antenna coupler with antenna elements designed as rod antennas and a transmitter and/or receiver device designed as a mobile telephone.

FIG. 3 shows a schematic plan view of the antenna coupler 2 with three antenna elements designed, in a further exemplary embodiment, as rod antennas 60, 62, 64 and one transmitter and/or receiver device designed as a mobile telephone 4. The mobile telephone 4 is held in the holding element 6 and contains an integrated antenna arrangement, which is not visible in FIG. 3.

The antenna elements designed as rod antennas 60, 62, 64 are oriented with the respective transverse axis of the rod of the rod antenna 60, 62, 64 towards the mobile telephone 4 positioned at the coordinate origin 58, and the directions of maximum radiation, which are indicated with dotted lines in FIG. 3, extend along the coordinate axes x, y, z of the Cartesian coordinate system. The spacing distances between the mobile telephone 4, in particular, between the antenna arrangement integrated within the latter, and each rod antenna 60, 62, 64 correspond with one another and are substantially λ/4 of the mean wavelength of the waves transmitted and/or received by the rod antenna 60, 62, 64.

The rod antennas 60, 62, 64 are guided to the antenna base 42 via connecting lines 48, which each provide the same electrical length.

Figure 4:
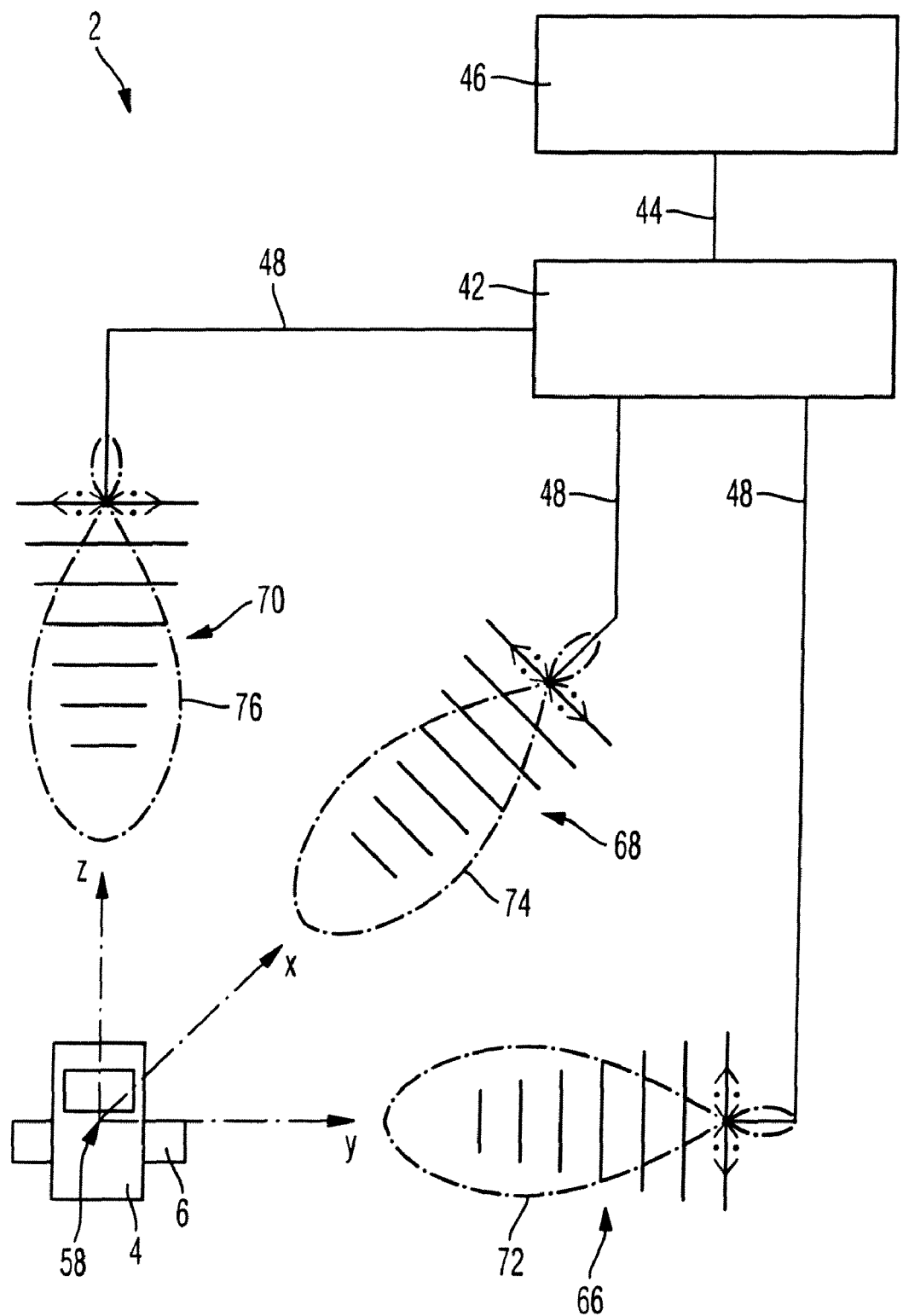
FIG. 4 shows schematically a plan view of an antenna coupler with antenna elements designed as Yagi antennas and a transmitter and/or receiver device designed as a mobile telephone.

FIG. 4 shows a schematic plan view of the antenna coupler 2 with three antenna elements designed, in a further exemplary embodiment, as Yagi antennas 66, 68, 70 and the transmitter and/or receiver device designed as a mobile telephone 4. The mobile telephone 4 is held in the holding element 6 and contains an integrated antenna arrangement, which is not visible in FIG. 4.

As in the case of the exemplary embodiment according to FIG. 3, the Yagi antennas 66, 68, 70 in the exemplary embodiment according to FIG. 4 are provided on coordinate axes x, y, z of the Cartesian coordinate system with the mobile telephone 4 disposed at the coordinate origin 58 and each provide the same spacing distance relative to the mobile telephone 4. In this context, the main lobes 72, 74, 76 of the Yagi antennas 66, 68, 70 each point in the direction towards the mobile telephone 4.

The Yagi antennas 66, 68, 70 are guided to the antenna base 42 via connecting lines 48, which each provide the same electrical length.

The invention is not restricted to the exemplary embodiment illustrated, in particular, not the antenna-element arrangements of the antenna coupler shown in the exemplary embodiments and the transmitter and/or receiver device designed as the mobile telephone. Under some circumstances, the antenna elements can also be displaceable along the x-, y- or z-axis or may be rotatable about an axis perpendicular to the latter. All of the features described above and presented in the drawings can be combined with one another as required.

The invention claimed is:

1. Antenna coupler for testing a transmitter and/or receiver device, comprising a holding element for the transmitter and/or receiver device and with several antenna elements, which are arranged in such a manner that the directions of maximum radiation or respectively directions of maximum sensitivity of the antenna elements are oriented differently relative to one another in space, wherein an orientation of the direction of maximum radiation and/or the direction of maximum sensitivity for every antenna element is separately adjustable for different radiation-diagram configurations.

2. Antenna coupler according to claim 1, wherein at least one of the antenna elements is oriented with directions of maximum sensitivity and/or directions of maximum radiation in the direction towards the transmitter and/or receiver device.

3. Antenna coupler according to claim 1, wherein the power radiated from the antenna elements is separately adjustable for each antenna element.

4. Antenna coupler according to claim 1, wherein the antenna elements can each be positioned at variable distances relative to the transmitter and/or receiver device.

5. Antenna coupler according to claim 4, wherein a spacing distance between the respective antenna element and the transmitter and/or receiver device is substantially λ/4, wherein λ corresponds to the mean wavelength of the waves received by or respectively radiated from the antenna element.

6. Antenna coupler according to claim 1, wherein in each case, one antenna element is disposed on a coordinate axis (x, y, z) of a coordinate system, wherein the transmitter and/or receiver device is positioned at a coordinate origin of the coordinate system of the holding element.

7. Antenna coupler according to claim 6, wherein the coordinate axes (x, y, z) are oriented in an orthogonal manner relative to one another within the coordinate system.

8. Antenna coupler according to claim 6, wherein an antenna element is provided on one of the coordinate axes (x, y, z) in each case in the positive coordinate-axis direction and/or in the negative coordinate-axis direction.

9. Antenna coupler according to claim 1, wherein the antenna elements are arranged substantially at corners of an octahedron, wherein the holding element positions the transmitter and/or receiver device at the center point of the octahedron.

10. Antenna coupler according to claim 1, wherein
the antenna elements are designed as at least one of rod antennas, Yagi antennas, and loop antennas.

11. Antenna coupler according to claim 10,
wherein an antenna element is designed as a loop antenna and
a loop of the antenna element designed as a loop antenna is formed substantially in the shape of a circular ring.

12. Antenna coupler according to claim 11,
wherein
a circumference of the loop of the antenna element designed as a loop antenna corresponds to the mean wavelength λ of the waves received or respectively radiated via the antenna element.

13. Antenna coupler according to claim 10, wherein
at least one antenna element is designed as a loop element and is mounted in a rotatable manner about a central axis, which is oriented perpendicular to a plane formed by a loop of the loop antenna, for the adjustment of a polarization direction of waves radiated and/or received via the antenna element.

14. Antenna coupler according to claim 13,
wherein
at least one antenna element is designed as a loop antenna and is oriented with reference to the transmitter and/or receiver device, positioned by the holding element at the coordinate origin of the coordinate system in such a manner that the central axis of the loop antenna extends along one of the coordinate axes (x, y, z) of the coordinate system.

15. Antenna coupler according to claim 1, wherein
each connecting line between respectively a feedpoint provided on each of the antenna elements and an antenna base of the antenna coupler provides the same electrical length.

16. Antenna coupler according to claim 1, wherein
the holding element provides a fastening device for fixing the transmitter and/or receiver device.

\* \* \* \* \*